(12) United States Patent
Park et al.

(10) Patent No.: US 8,350,254 B2
(45) Date of Patent: Jan. 8, 2013

(54) MULTILAYER POLYMER ELECTROLUMINESCENT DEVICE COMPRISING WATER-SOLUBLE POLYMER LAYER CONTAINING CATIONS AND METHOD FOR FABRICATING THE SAME

(75) Inventors: Dong Kyu Park, Busan (KR); Hyung Suk Woo, Busan (KR); Tae-Woo Kwon, Busan (KR); Seong-Jin Cho, Busan (KR)

(73) Assignee: Kyungsung University Industry Cooperation Foundation, Busan (KR)

( * ) Notice: Subject to any disclaimer, the term of this patent is extended or adjusted under 35 U.S.C. 154(b) by 233 days.

(21) Appl. No.: 12/668,528

(22) PCT Filed: Feb. 12, 2008

(86) PCT No.: PCT/KR2008/000815
§ 371 (c)(1), (2), (4) Date: Jun. 10, 2010

(87) PCT Pub. No.: WO2009/008576
PCT Pub. Date: Jan. 15, 2009

(65) Prior Publication Data
US 2010/0252821 A1    Oct. 7, 2010

(30) Foreign Application Priority Data

Jul. 12, 2007  (KR) .................. 10-2007-0070300

(51) Int. Cl.
| | |
|---|---|
| H01L 29/08 | (2006.01) |
| H01L 35/24 | (2006.01) |
| H01L 51/00 | (2006.01) |
| H01L 29/06 | (2006.01) |
| H01L 29/12 | (2006.01) |
| H01L 31/0328 | (2006.01) |
| H01L 31/0336 | (2006.01) |
| H01L 31/072 | (2012.01) |
| H01L 31/109 | (2006.01) |
| H01L 27/15 | (2006.01) |
| H01L 29/26 | (2006.01) |
| H01L 31/12 | (2006.01) |
| H01L 33/00 | (2010.01) |
| H01L 29/22 | (2006.01) |
| H01L 21/66 | (2006.01) |
| G01R 31/26 | (2006.01) |

(52) U.S. Cl. ................. 257/40; 257/13; 257/79; 257/94; 257/E31.095; 257/E31.125; 257/E33.061; 257/E33.055; 257/E51.027; 438/82; 438/99

(58) Field of Classification Search ..................... 257/13, 257/40, 79, 94, E31.095, E31.125, E33.061, 257/E33.055, E51.027; 438/82, 99
See application file for complete search history.

(56) References Cited

U.S. PATENT DOCUMENTS
3,975,496 A * 8/1976 Smalley et al. ............... 423/122
(Continued)

FOREIGN PATENT DOCUMENTS
WO    WO 2006/035958 A1    4/2006

*Primary Examiner* — Ida M Soward
(74) *Attorney, Agent, or Firm* — Alston & Bird LLP

(57) ABSTRACT

A polymer electroluminescent device is provided. The device includes an anode, a light-emitting layer, a cation-containing water-soluble polymer layer and a cathode formed in this order on a substrate wherein the cation-containing water-soluble polymer layer is formed by wet coating. The cation-containing water-soluble polymer layer as a secondary thin film layer is not dissolved in a solvent for the formation of the underlying light-emitting layer to prevent intermixing between the two layers, thereby enabling the formation of a multilayer structure by wet coating. In addition, the cation-containing water-soluble polymer layer attracts electrons injection from the cathode by an attractive Coulomb force to effectively increase the mobility of the electrons while blocking high-mobility holes from the anode at an interface between the light-emitting layer and the water-soluble layer. Further provided is a method for fabricating the electroluminescent device.

15 Claims, 4 Drawing Sheets

U.S. PATENT DOCUMENTS

| | | | |
|---|---|---|---|
| 4,973,141 A * | 11/1990 | Baucke et al. | 359/267 |
| 5,456,745 A * | 10/1995 | Roreger et al. | 106/140.1 |
| 5,602,659 A * | 2/1997 | Adachi et al. | 349/27 |
| 6,586,763 B2 * | 7/2003 | Wang et al. | 257/40 |
| 6,611,096 B1 * | 8/2003 | McCormick et al. | 313/506 |
| 6,806,491 B2 * | 10/2004 | Qiu et al. | 257/40 |
| 7,033,646 B2 * | 4/2006 | Zhang | 427/487 |
| 7,199,521 B2 * | 4/2007 | Ibe | 313/506 |
| 7,276,726 B2 * | 10/2007 | Grushin et al. | 257/40 |
| 7,358,538 B2 * | 4/2008 | Lu et al. | 257/97 |
| 7,473,923 B2 * | 1/2009 | Tsutsui et al. | 257/40 |
| 7,476,603 B2 * | 1/2009 | Grinwald et al. | 438/584 |
| 7,737,630 B2 * | 6/2010 | Seo et al. | 313/506 |
| 7,910,400 B2 * | 3/2011 | Kwon et al. | 438/99 |
| 7,911,134 B2 * | 3/2011 | Prakash et al. | 313/506 |
| 8,153,029 B2 * | 4/2012 | Hsu | 252/500 |
| 2004/0056266 A1 | 3/2004 | Suh et al. | |
| 2006/0008740 A1 | 1/2006 | Kido | |
| 2006/0234075 A1 * | 10/2006 | Watanabe | 428/522 |
| 2007/0057624 A1 * | 3/2007 | Angelopoulos et al. | 313/503 |
| 2007/0176148 A1 * | 8/2007 | Park et al. | 252/301.16 |
| 2009/0200933 A1 * | 8/2009 | Smith et al. | 313/504 |
| 2010/0019228 A1 * | 1/2010 | Jiang et al. | 257/40 |
| 2012/0037852 A1 * | 2/2012 | Seshadri et al. | 252/500 |

* cited by examiner

[Fig. 1]
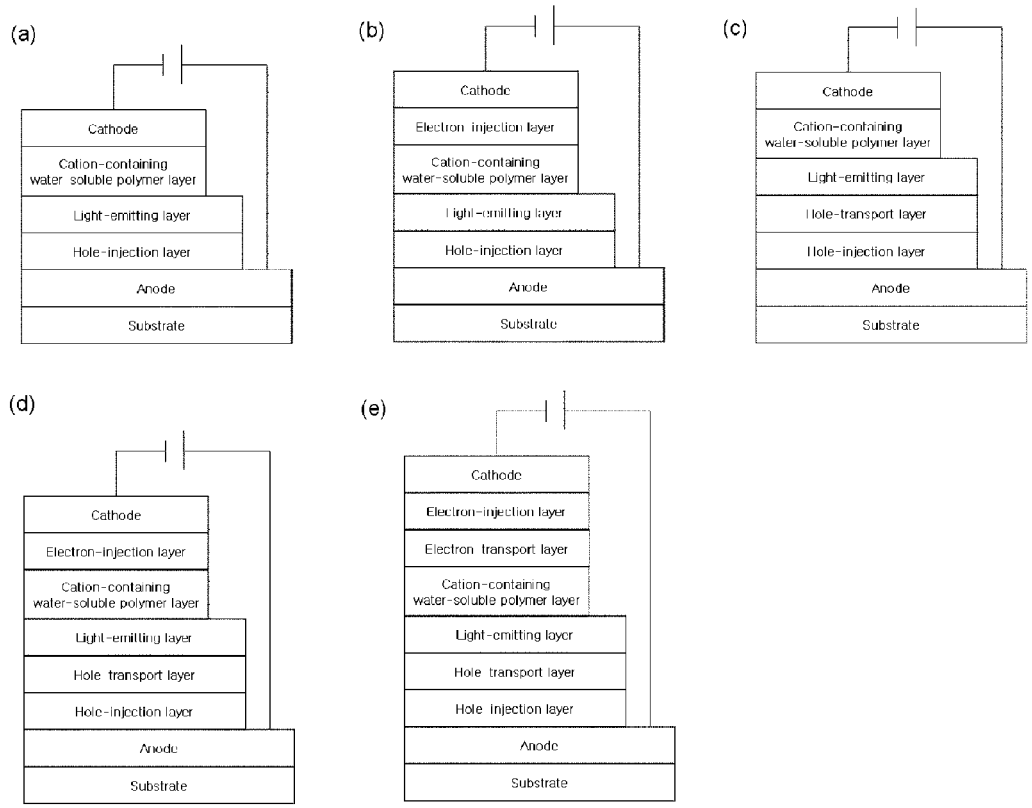
[Fig. 2]
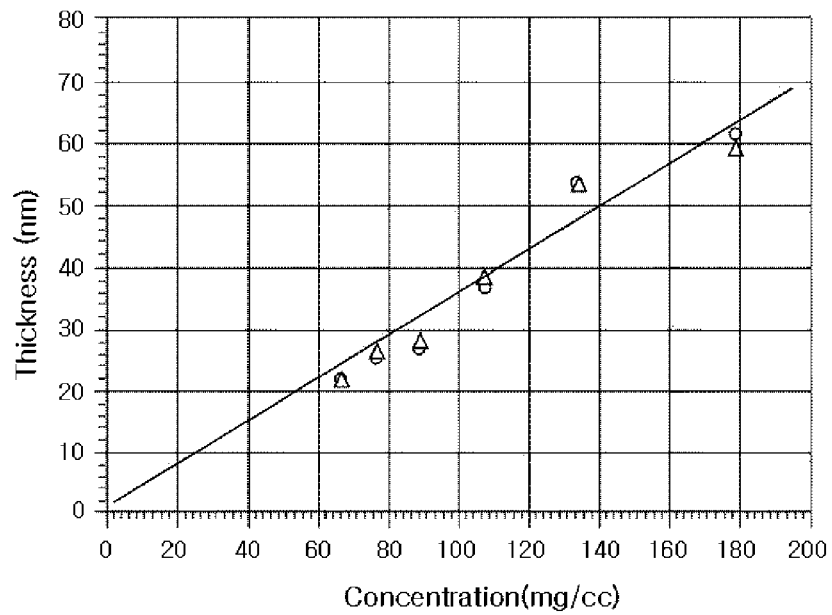

[Fig. 3]
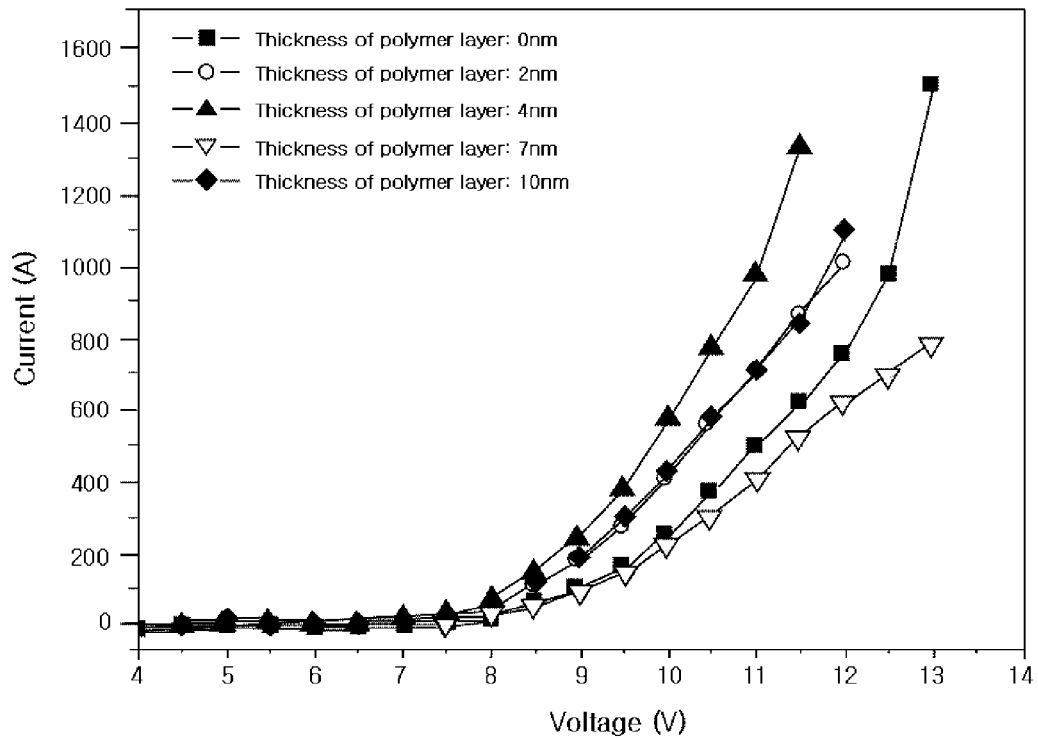
[Fig. 4]
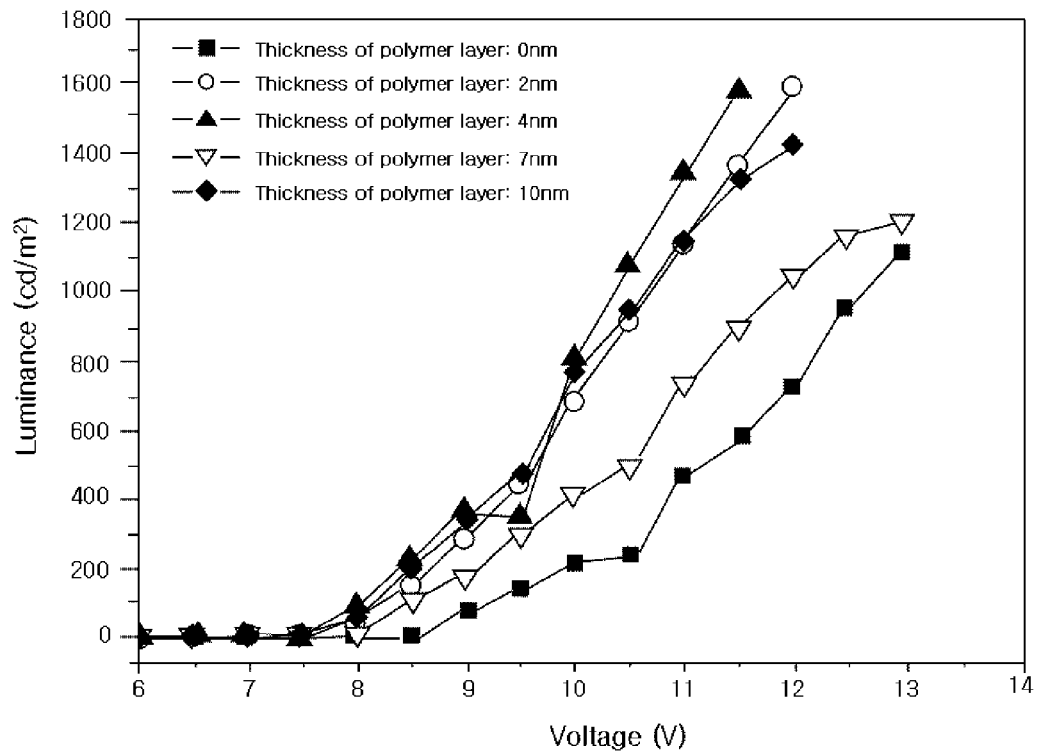

[Fig. 5]
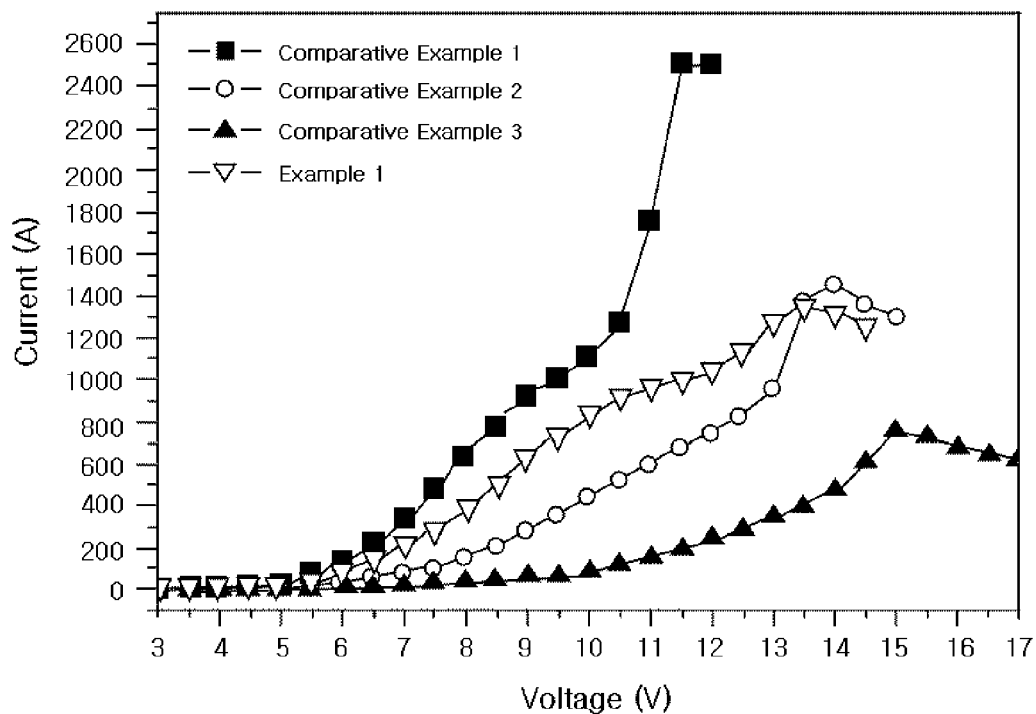
[Fig. 6]
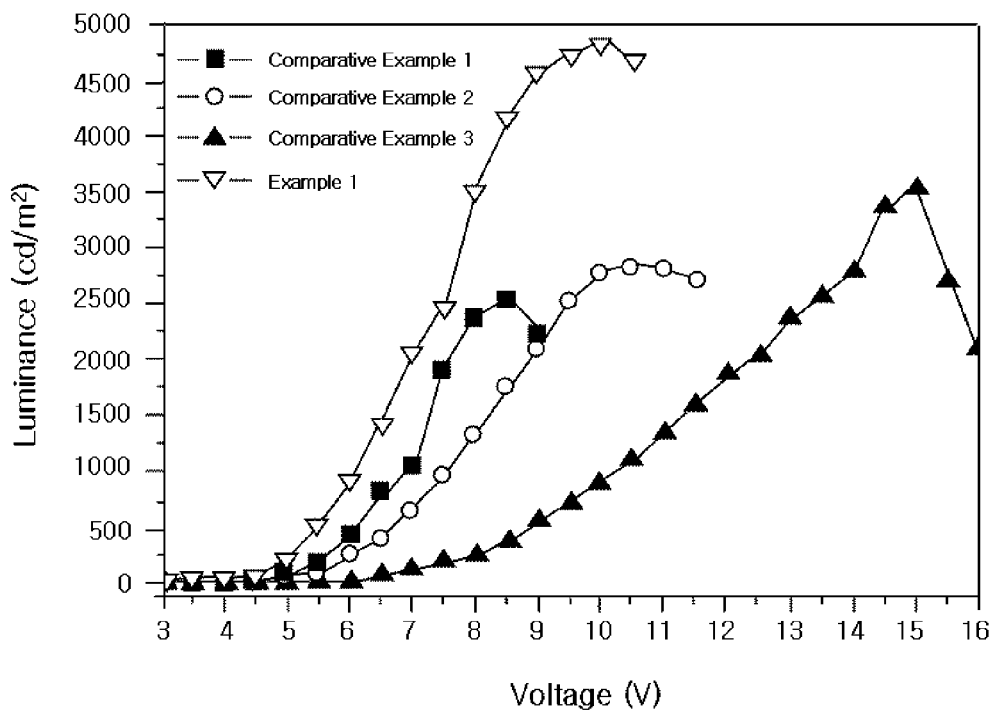

[Fig. 7]
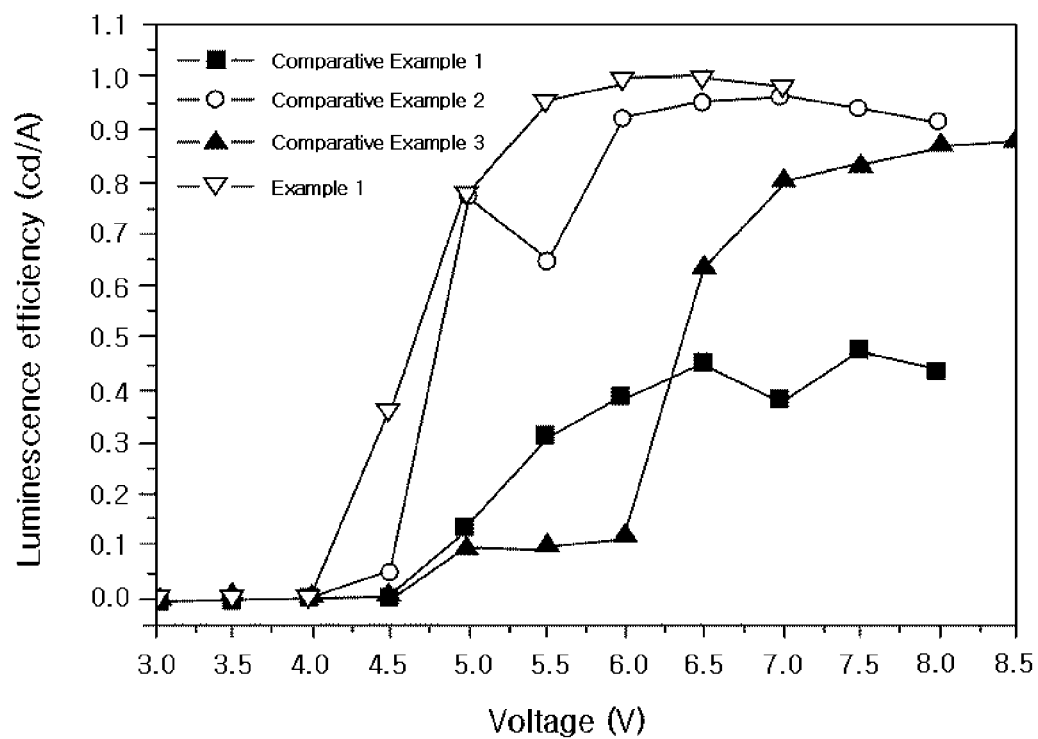

MULTILAYER POLYMER ELECTROLUMINESCENT DEVICE COMPRISING WATER-SOLUBLE POLYMER LAYER CONTAINING CATIONS AND METHOD FOR FABRICATING THE SAME

TECHNICAL FIELD

The present invention relates to a polymer electroluminescent device and a method for fabricating the electroluminescent device. More particularly, the present invention relates to a polymer electroluminescent device comprising an anode, a light-emitting layer, a cation-containing water-soluble polymer layer as a secondary thin film layer and a cathode formed in this order on a substrate wherein the cation-containing water-soluble polymer layer does not dissolve the formation of the light-emitting layer and prevents intermixing between the emitting polymer layer and the water-soluble insulating layer, thereby not only enabling the formation of a multilayer structure by wet coating but also attracting electrons injected from the cathode due to attractive Coulomb force, which results in effective increase in mobility of the electrons while blocking high-mobility holes injected from the anode nearby the interface between the emitting polymer layer and the water-soluble insulating layer, and a method for fabricating the electroluminescent device.

BACKGROUND ART

Organic electroluminescent (EL) devices (or organic light-emitting diodes (OLEDs)) are active emissive display devices based on the phenomenon that electrons combine with holes to emit light in a fluorescent or phosphorescent organic compound thin film when a current is applied to the organic film. Organic EL devices can be reduced in weight. Further, organic EL devices can be fabricated using a smaller number of components and parts in a simple manner. Further, organic EL devices have the advantages of high image quality and wide viewing angle. Other advantages of organic EL devices are fast response time that is suitable for dynamic images with high color purity, low power consumption, and low driving voltage. That is, organic EL devices have electrical properties suitable for use in portable electronic devices.

Novel phosphorescent materials and multilayer structures have been developed and introduced to increase the internal quantum efficiency of organic EL devices to 100%. Extensive research and development on new multilayer structures of organic EL devices has been focused on balancing holes and electrons in an emitting zone to improve the stability and characteristics of the organic EL devices.

Organic EL devices can be largely classified into organic EL devices (OLEDs) using low molecular weight materials and polymer EL devices (PLEDs) using high molecular weight materials according to the characteristics of the materials and the formation processes of organic films using the materials. For example, low-molecular-weight OLEDs are clearly distinguished from PLEDs in that organic films of low-molecular-weight OLEDs are mainly formed by vacuum evaporation whereas those of PLEDs are formed by spin-coating or printing.

Research has been conducted on new multilayer structures of PLEDs and proposals have been made that the structures are advantageous in terms of stability and efficiency of the devices. Unlike low-molecular-weight OLEDs, there are difficulties in fabricating PLEDs with a multilayer structure. The reason for the difficulties is that polymer films of PLEDs are formed by wet processing. For example, when a light-emitting layer as a primary thin film layer is formed on a substrate and a solution of a material for a secondary thin film layer (e.g., an electron injection layer) is applied thereto, the primary thin film layer is dissolved and slightly swollen by a solvent of the solution containing the secondary material. Therefore, it is important to choose appropriate solvents for the primary and the secondary materials for a multilayer structure in PLEDs. These problems arising from the use of solvents are substantially inevitable so long as a constituent material of a buffer layer between thin film layers is soluble in the solvents and has no cross-linkage, resulting in damage to the fundamental stability of PLEDs.

Therefore, the intermixing between primary and secondary thin film layers due to dissolution of the primary thin film layer by a solvent for the formation of the secondary thin film layer should be completely prevented with introduction of novel multilayer structures and this will be meaningful in improving the stability, luminescence efficiency and luminance of devices.

DISCLOSURE OF INVENTION

Technical Problem

It is a first object of the present invention to provide a polymer electroluminescent device comprising an anode, a light-emitting layer, a cation-containing water-soluble polymer layer and a cathode formed in this order on a substrate wherein the cation-containing water-soluble polymer layer attracts electrons from the cathode by an attractive Coulomb force and increases the electron mobility while blocking high-mobility holes from the anode at an interface between the light-emitting layer and the water-soluble polymer layer.

It is a second object of the present invention to provide a method for fabricating a polymer electroluminescent device by forming a cation-containing water-soluble polymer layer as a secondary thin film layer on a light-emitting layer wherein the cation-containing water-soluble polymer layer is not dissolved in a solvent for the formation of the light-emitting layer to prevent intermixing between the two layers, thus enabling the formation of a multilayer structure by wet coating.

Technical Solution

In order to accomplish the first object of the present invention, there is provided a polymer electroluminescent device comprising an anode, a light-emitting layer, a cation-containing water-soluble polymer layer and a cathode formed in this order on a substrate wherein the cation-containing water-soluble polymer layer is formed by wet coating.

In an embodiment of the present invention, the cation-containing water-soluble polymer layer may contain a water-soluble polyurethane resin.

In a further embodiment of the present invention, the water-soluble polyurethane resin may be polyurethane-polyurea, polyurethane-polyacrylate, or a mixture thereof.

In another embodiment of the present invention, the cation-containing water-soluble polymer layer may have a thickness of 1 to 10 nm.

In another embodiment of the present invention, the cation-containing water-soluble polymer layer may contain at least one kind of cations selected from the group consisting of $Cs^+$, $Li^+$, $Na^+$, $K^+$, $Be^{2+}$, $Mg^{2+}$, $Ca^{2+}$, $Ba^{2+}$, $Al^{3+}$ and $Ag^{2+}$ cations.

In another embodiment of the present invention, the light-emitting layer may be composed of a blue, red or green light emitting material.

In another embodiment of the present invention, the polymer electroluminescent device may further comprise at least one layer selected from the group consisting of a hole injection layer, a hole transport layer, an electron transport layer and an electron injection layer between the anode and the cathode.

In still another embodiment of the present invention, the polymer electroluminescent device may have a multilayer structure consisting of:

an anode/a hole injection layer/a light-emitting layer/a cation-containing water-soluble polymer layer/a cathode;

an anode/a hole injection layer/a light-emitting layer/a cation-containing water-soluble polymer layer/an electron injection layer/a cathode;

an anode/a hole injection layer/a hole transport layer/a light-emitting layer/a cation-containing water-soluble polymer layer/a cathode;

an anode/a hole injection layer/a hole transport layer/a light-emitting layer/a cation-containing water-soluble polymer layer/an electron injection layer/a cathode; or an anode/a hole injection layer/a hole transport layer/a light-emitting layer/a cation-containing water-soluble polymer layer/an electron transport layer/an electron injection layer/a cathode.

In order to accomplish the second object of the present invention, there is provided a method for fabricating a polymer electroluminescent device, the method comprising the steps of forming an anode on a substrate, forming a light-emitting layer on the anode, forming a cation-containing water-soluble polymer layer on the light-emitting layer and a cathode on the cation-containing water-soluble polymer layer wherein the cation-containing water-soluble polymer layer is formed by wet coating.

In an embodiment of the present invention, the wet coating is performed using a solution of a water-soluble polymer in cation-containing distilled water.

In a further embodiment of the present invention, the water-soluble polymer may be a water-soluble polyurethane resin.

In another embodiment of the present invention, the water-soluble polymer may be present at a concentration of 0.4 to 2% by weight in the cation-containing solution of the water-soluble polymer.

In another embodiment of the present invention, the cation-containing distilled water may be prepared by purifying a solution of an ionic compound containing both cations and anions by column chromatography to selectively separate the cations only.

In another embodiment of the present invention, the cations may be present at a concentration of 1 to 20 ppm in the cation-containing distilled water.

In another embodiment of the present invention, the cations are selected from the group consisting of $Cs^+$, $Li^+$, $Na^+$, $Be^{2+}$, $Mg^{2+}$, $Ca^{2+}$, $Ba^{2+}$, $Al^{3+}$, $Ag^{2+}$ cations, and combinations thereof.

In another embodiment of the present invention, the cation-containing water-soluble polymer layer may have a thickness of 1 to 10 nm.

In still another embodiment of the present invention, the method may further comprise the step of forming at least one layer selected from the group consisting of a hole injection layer, a hole transport layer, an electron transport layer and an electron injection layer between the anode and the cathode.

Advantageous Effects

According to the polymer electroluminescent device and the method of the present invention, a cation-containing water-soluble polymer layer as a secondary thin film layer is not dissolved in a solvent for the formation of an underlying light-emitting layer to prevent intermixing between the two layers, thereby enabling the formation of a multilayer structure by wet coating. In addition, the cation-containing water-soluble polymer layer attracts electrons from a cathode by an attractive Coulomb force and increases the electron mobility while blocking high-mobility holes from an anode at an interface between the light-emitting layer and the water-soluble polymer layer.

BRIEF DESCRIPTION OF THE DRAWINGS

FIGS. 1a to 1e are schematic cross-sectional views illustrating the structures of polymer electroluminescent devices according to embodiments of the present invention.

FIG. 2 is a graph showing the selection of thicknesses of cation-containing water-soluble polymer layers formed using a cation-containing water-soluble polymer at different concentrations in the fabrication of polymer electroluminescent devices according to embodiments of the present invention.

FIG. 3 is a graph showing the voltage-current characteristics of polymer electroluminescent devices according to embodiments of the present invention with respect to the thicknesses of water-soluble polymer layers.

FIG. 4 is a graph showing the luminance-voltage characteristics of polymer electroluminescent devices according to embodiments of the present invention with respect to the thicknesses of water-soluble polymer layers.

FIG. 5 is a graph showing the current characteristics of polymer electroluminescent devices fabricated in Example 1 and Comparative Examples 1 to 3 in response to voltages applied to the devices.

FIG. 6 is a graph showing the luminance characteristics of polymer electroluminescent devices fabricated in Example 1 and Comparative Examples 1 to 3 in response to voltages applied to the devices.

FIG. 7 is a graph showing the luminescence efficiency of polymer electro-luminescent devices fabricated in Example 1 and Comparative Examples 1 to 3 in response to voltages applied to the devices.

BEST MODE FOR CARRYING OUT THE INVENTION

Exemplary embodiments of the present invention will now be described in greater detail.

The present invention provides a polymer electroluminescent device comprising anode, a light-emitting layer, a cation-containing water-soluble polymer layer and cathode formed in this order on a substrate wherein the cation-containing water-soluble polymer layer is formed by wet coating.

The cation-containing water-soluble polymer layer serves to prevent intermixing between the light-emitting layer and the overlying secondary thin film layer and to maintain a balance of injected electrons and holes within the light-emitting layer.

The cation-containing water-soluble polymer layer is formed by dissolving a water-soluble polymer in a solution containing particular cations and wet-coating the resulting solution on the light-emitting layer, which is dissolved in an organic solvent. As a result, no dissolution or slight swelling of the light-emitting layer occurs in the polymer electroluminescent device, resulting in improvements in the stability and efficiency of the electroluminescent device. Further, the cation-containing water-soluble polymer layer may be cured to form a solid thin film layer. In this case, although another cation-containing water-soluble polymer layer is formed on the solid thin film layer, no intermixing occurs between the two water-soluble polymer layers, thus allowing the polymer electroluminescent device to have various multilayer structures.

In a typical organic electroluminescent device, the mobility of holes from an anode is higher than that of electrons from a cathode. In contrast, in the polymer electroluminescent device of the present invention, the water-soluble polymer contained in the cation-containing water-soluble polymer layer plays a role in blocking the holes from the anode to allow the holes to stay longer in the light-emitting layer. Further, cations contained in the water-soluble polymer layer play a role in attracting electrons from the cathode by an attractive Coulomb force and in increasing the mobility of the electrons. That is, the polymer electroluminescent device of the present invention has a mixed structure of a metal-insulator-semiconductor (MIS) device and a P-type-N-type (P/N) junction. With this configuration, the efficiency of the organic electroluminescent device is maximized.

The cation-containing water-soluble polymer layer is introduced to attract electrons while blocking the holes. These simultaneous functions of the cation-containing water-soluble polymer layer increase the radiative recombination of polaronic exciton within the light-emitting layer, leading to improvements in the overall luminescence efficiency and luminance of the polymer electroluminescent device according to the present invention.

Particularly, the polymer electroluminescent device of the present invention is largely characterized in that the two functions, i.e. blocking of the holes and attraction of electrons, are simultaneously achieved by one thin film layer rather than several separate layers, i.e. a thin film layer for blocking the holes and a thin film layer for attracting electrons and a thin film layer for electron transport etc. That is, the multi-functional property is employed to simplify the multilayer structure of the final device and vary the multilayer structure in various forms.

To further enhance the electron attraction, an ionic compound layer is simply introduced into a conventional organic electroluminescent device, whereas cations separated from an ionic compound are introduced into the water-soluble polymer layer of the device according to the present invention. In conclusion, the polymer electroluminescent device of the present invention exhibits improved luminance characteristics and luminescence efficiency, compared to a device structure comprising a water-soluble polymer layer containing no cations, a device structure comprising an ionic compound layer or a device structure comprising a water-soluble polymer layer and an ionic compound layer formed separately from each other.

The water-soluble polymer is preferably a water-soluble polyurethane resin. The water-soluble polyurethane resin may be polyurethane-polyurea, polyurethane-poly-acrylate, or a mixture thereof.

A general polyurethane resin can be synthesized using an isocyanate compound and a polyester- or polyether-type polyol compound as intermediates. A water-soluble polyurethane resin in a polyurethane-polyurea form can be prepared by reacting a polyurethane prepolymer terminated with isocyanate groups with a polyhydric amine, e.g., triethylenetetraamine (TETA). A water-soluble polyurethane resin in a polyurethane-polyacrylate form can be prepared by reacting a polyurethane prepolymer terminated with isocyanate groups with a monomer, e.g., ethylene glycol dimethacrylate (EGDMA).

Synthetic methods of the polyurethane-polyurea resin and the polyurethane-poly-acrylate resin are schematically depicted in Reaction Schemes 1 and 2.

Reaction Scheme 1: Synthesis of polyurethane-polyurea

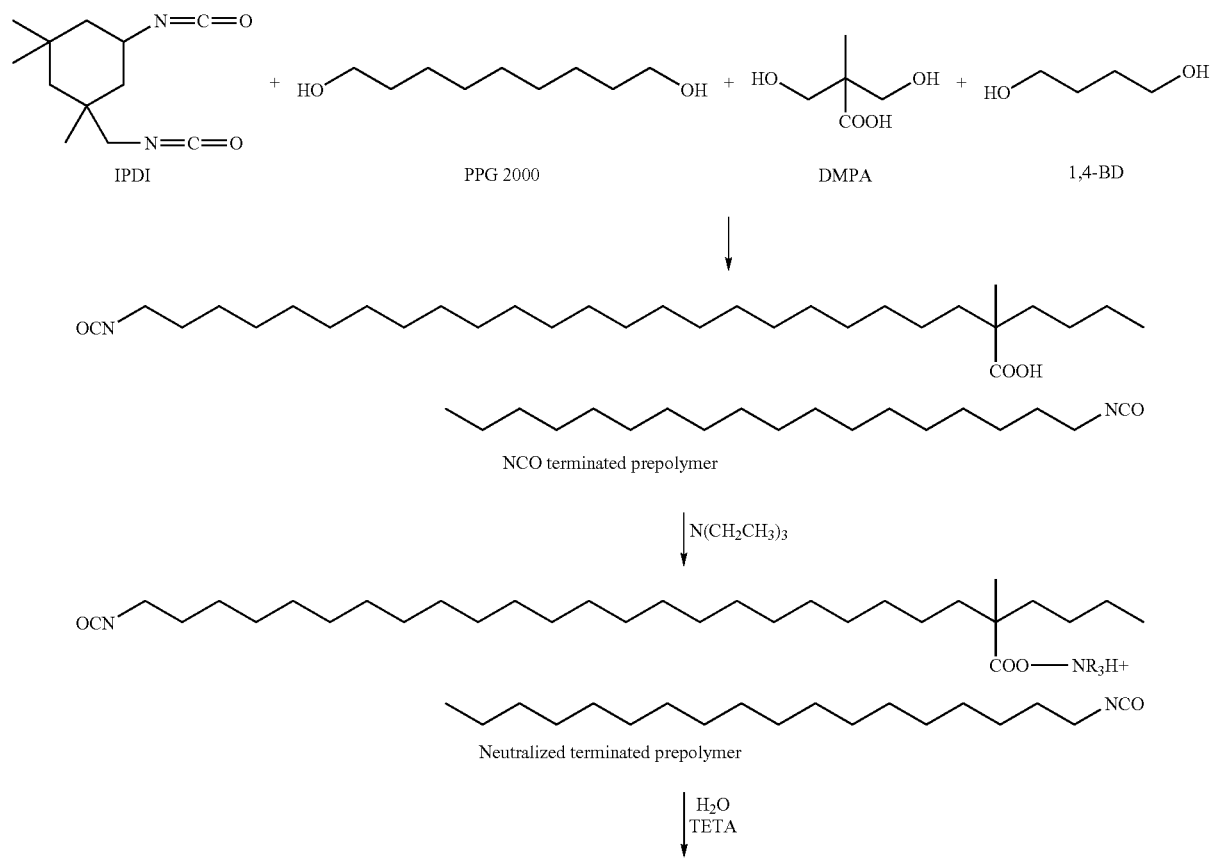

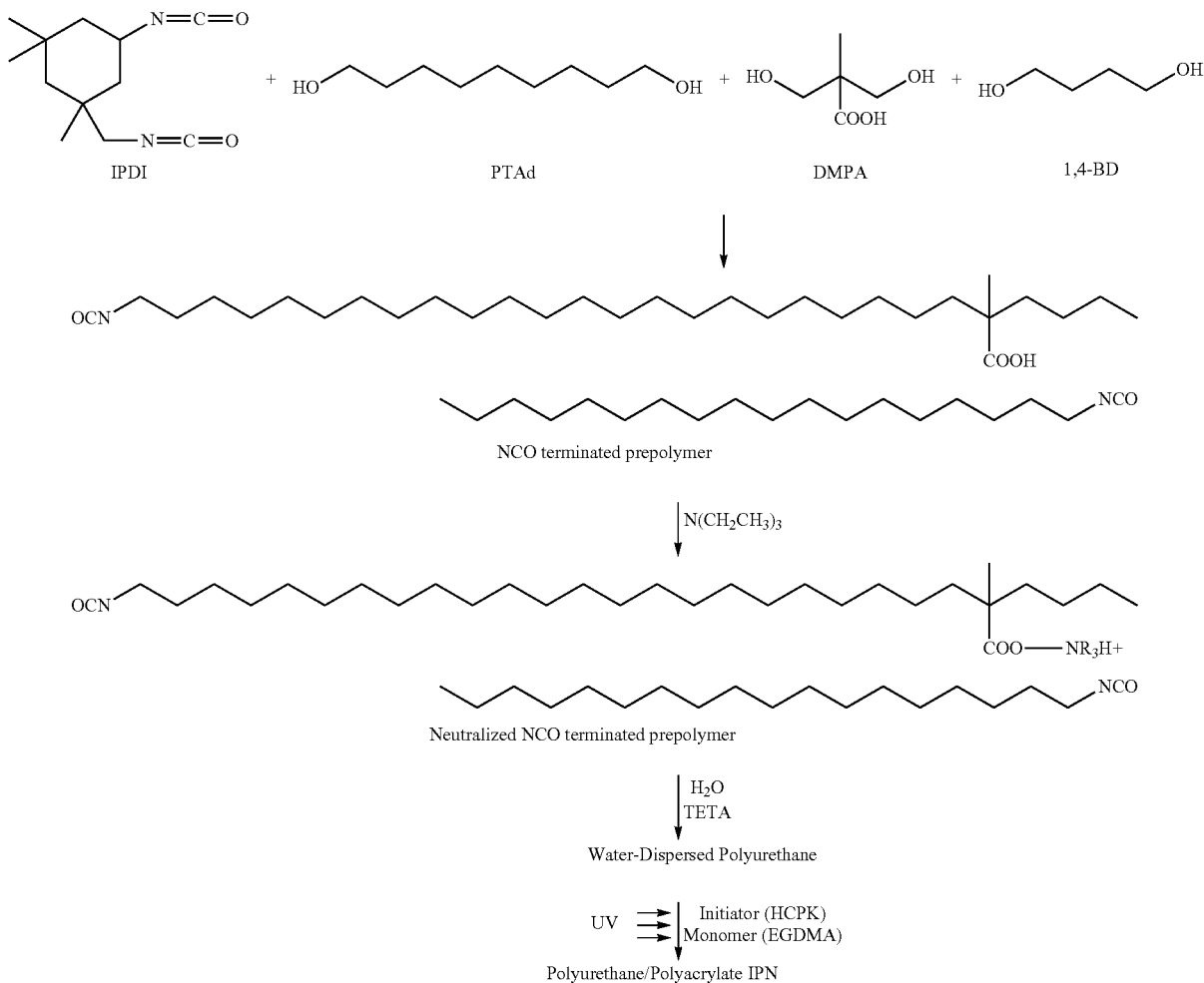

Reaction Scheme 2: Synthesis of polyurethane-polyacrylate

The cation-containing water-soluble polymer layer of the polymer electroluminescent device according to the present invention preferably has a thickness of 1 to 10 nm. When the cation-containing water-soluble polymer layer has a thickness of less than 1 nm, the holes are not effectively blocked and the attraction of electrons is insufficient, resulting in a reduction in the luminescence efficiency of the device. Meanwhile when the cation-containing water-soluble polymer layer has a thickness of more than 10 nm, electrons do not efficiently reach the light-emitting layer, resulting in a reduction in the luminescence efficiency of the device.

On the other hand, there is no limitation on the kind of the cations contained in the water-soluble polymer layer so long as the cations attract electrons injected from the cathode by an electrostatic force. The cations are preferably selected from the group consisting of, but not limited to, $Cs^+$, $Li^+$, $Na^+$, $K^+$, $Be^{2+}$, $Mg^{2+}$, $Ca^{2+}$, $Ba^{2+}$, $Al^{3+}$, $Ag^{2+}$ cations, and combinations thereof.

There is no particular limitation on the kind of a material for the light-emitting layer of the polymer electroluminescent device according to the present invention. Examples of suitable materials for the light-emitting layer include blue, red and green light emitting materials, and materials emitting light over the entire visible spectral region.

The polymer electroluminescent device of the present invention may further comprise at least one layer selected from the group consisting of a hole injection layer, a hole transport layer, an electron transport layer and an electron injection layer. These optional layers function to efficiently transfer holes or electrons to the light-emitting layer to increase the probability of recombination of the holes with the electrons for light emission within the light-emitting layer. Each of the optional layers may be composed of any material that is commonly employed in the art.

Various structures of polymer electroluminescent devices according to embodiments of the present invention will be explained in more detail with reference to FIGS. 1a to 1e.

The device shown in FIG. 1a has a structure consisting of an anode/a hole injection layer/a light-emitting layer/a cation-containing water-soluble polymer layer/a cathode. The device shown in FIG. 1b has a structure consisting of an anode/a hole injection layer/a light-emitting layer/a cation-containing water-soluble polymer layer/an electron injection layer/a cathode. The device shown in FIG. 1c has a structure consisting of an anode/a hole injection layer/a hole transport layer/a light-emitting layer/a cation-containing water-soluble polymer layer/a cathode. The device shown in FIG. 1d has a structure consisting of an anode/a hole injection layer/a hole transport layer/a light-emitting layer/a cation-containing water-soluble polymer layer/an electron injection layer/a cathode. The device shown in FIG. 1e has a structure consisting of an anode/a hole injection layer/a hole transport layer/a light-emitting layer/a cation-containing water-soluble polymer layer/an electron transport layer/an electron injection layer/a cathode.

The present invention also provides a method for fabricating a polymer electroluminescent device. Specifically, the method of the present invention comprises the steps of forming an anode on a substrate, forming a light-emitting layer on the anode, forming a cation-containing water-soluble polymer layer on the light-emitting layer and a cathode on the cation-containing water-soluble polymer layer wherein the cation-containing water-soluble polymer layer is formed by wet coating.

An explanation of the method according to the present invention will be given below. First, anode material is coated on a substrate. Substrates suitable for use in the fabrication of common organic electroluminescent devices can be used in the present invention. A glass and plastic substrate is preferred in view of transparency, surface smoothness, ease of handling and waterproofness. The anode may be an indium tin oxide (ITO)-coated glass substrate, which is most widely used in the fabrication of conventional organic electroluminescent devices. Examples of materials for the first electrode include transparent and highly conductive materials, such as tin oxide ($SnO_2$) and zinc oxide (ZnO).

Subsequently, at least one layer selected from a hole injection layer and a hole transport layer may be formed on the first electrode by a wet coating process, such as spin coating or ink-jet printing, and a light-emitting layer is formed thereon by a wet coating process, such as spin coating or ink-jet printing.

It is preferred that each of the hole injection layer and the hole transport layer have a thickness of 20 to 50 nm. The use of the layers having a thickness outside this range leads to poor hole injection and transport characteristics. The light-emitting layer preferably has a thickness of 50 to 120 nm. When the light-emitting layer has a thickness of less than 50 nm, the luminescence efficiency of the final device is reduced. Meanwhile, when the light-emitting layer has a thickness of more than 120 nm, the driving voltage of the final device is unfavorably increased.

Next, wet coating is performed to form a cation-containing water-soluble polymer layer on the light-emitting layer. Specifically, the cation-containing water-soluble polymer layer is formed by dissolving a water-soluble polymer (e.g., a polyurethane resin) in cation-containing distilled water and wet-coating the solution on the light-emitting layer.

As mentioned above, the water-soluble polymer may be a water-soluble polyurethane resin, such as polyurethane-polyurea, polyurethane-polyacrylate or a mixture thereof. The water-soluble polymer is preferably present at a concentration of 0.4 to 2% by weight in the cation-containing water-soluble polymer solution. The use of the water-soluble polymer at a concentration lower than 0.4% by weight makes the resulting water-soluble polymer layer relatively thin, which causes insufficient blocking of the flow of holes. Meanwhile, the use of the water-soluble polymer at a concentration higher than 2% by weight makes the water-soluble polymer layer relatively thick, which causes an imbalance of holes and electrons. In both cases, the luminescence efficiency of the final device is undesirably reduced.

The cation-containing water-soluble polymer solution is prepared by purifying a solution containing both cations and anions by an appropriate technique, such as column chromatography, to selectively separate the cations only. Column chromatography is a technique for separating or purifying individual components in a subject sample through a column based on solid-liquid phase-partitioning. The adsorptivity between the components (i.e. analytes) and the column is attributed to inter-molecular attractive forces, such as electrostatic attraction, complexation and hydrogen bonding. According to the method of the present invention, cations are selectively separated from an ionic compound solution containing both cations and anions. Specifically, an anion-exchange resin is packed into a column and the ionic compound solution is injected through the top of the column. The cations and anions contained in the ionic compound solution flow at different rates inside the column by selective adsorption of the anion-exchange resin thereto. After completion of the elution, the anions remain adsorbed on the anion-exchange resin and the cations only are left in the eluate. A determination is made as to the presence and concentration of the cations in the eluate. The anion-free solution can be used as a solution for wet coating.

The concentration of the cations in the cation-containing distilled water is preferably between 1 and 20 ppm. Below 1 ppm, little or no electron mobility is observed, i.e. electrons injected from the cathode are not substantially transferred. Meanwhile, above 20 ppm, adverse effects of electron mobility are observed due to the increased cation concentration, causing an imbalance of the electrons and the holes in the light-emitting layer. As a result, the luminescence efficiency of the final device is undesirably reduced.

As mentioned earlier, the cations may be selected from the group consisting of $Cs^+$, $Li^+$, $Na^+$, $K^+$, $Be^{2+}$, $Mg^{2+}$, $Ca^{2+}$, $Ba^{2+}$, $Al^{3+}$, $Ag^{2+}$ cations, and combinations thereof. The cation-containing water-soluble polymer layer preferably has a thickness of 1 to 10 nm.

Then, at least one layer selected from an electron transport layer and an electron injection layer is formed on the cation-containing water-soluble polymer layer by a wet coating process, such as spin coating or ink-jet printing. Preferably, the electron transport layer and the electron injection layer, which may be pure ionic compounds such as LiF, $Cs_2CO_3$, have thicknesses of 20-40 nm and 0.8-1 nm, respectively.

When the electron transport layer and the electron injection layer have thicknesses below the respective lower limits, sufficient electron transport and injection characteristics are difficult to realize. Meanwhile, when the electron transport layer and the electron injection layer have thicknesses above the respective upper limits, the driving voltage of the final device is unfavorably increased.

The cathode is formed on the electron transport layer or the electron injection layer by vacuum evaporation or sputtering to complete the fabrication of the polymer electroluminescent device according to the present invention. The cathode is made of a low work-function metal. Examples of suitable metals for the formation of the cathode include lithium (Li), magnesium (Mg), calcium (Ca), aluminum (Al), Ba:Li Ca:Li, aluminum-lithium (Al—Li), magnesium-indium (Mg—In), magnesium-silver (Mg—Ag), and calcium-aluminum (Ca—Al).

MODE FOR THE INVENTION

Hereinafter, the present invention will be explained in more detail with reference to the following examples and comparative examples. However, these examples are given for the purpose of illustration and are not intended to limit the present invention.

EXAMPLES

Preparation of Cation-Containing Water-Soluble Polymer Solution

A water-soluble polymer solution containing $Cs^+$ ions was wet-coated to form a cation-containing water-soluble polymer layer. Specifically, the cation-containing water-soluble polymer solution was prepared by the following procedure.

First, 0.002 g of CsF was dissolved in 200 ml of distilled water at 25 C. Column chromatography of the aqueous solution was performed to selectively adsorb $F^-$ ions to an anion-exchange resin (Amberlite IRA-410CL, ALDRICH). As a result, $Cs^+$ ions only were eluted from the mixture containing both cations and anions to obtain a cationic aqueous solution. The presence and concentration of the $Cs^+$ ions in the cationic aqueous solution were identified using an inductively coupled plasma (ICP) system (Perkin Elmer Optima 2100). The $Cs^+$ ions were found to be present at a concentration of 10 ppm in the cationic aqueous solution.

0.035 g of a water-soluble polyurethane-polyurea resin was dissolved in 8.4 ml of the cationic aqueous solution at 25 C to prepare a cation-containing water-soluble polymer solution.

Determination of Thickness of the Cation-Containing Water-Soluble Polymer Layer

Reference was made to data concerning the optimum thickness of water-soluble polymer layers to determine the optimum thickness of the cation-containing water-soluble polymer layer.

Water-soluble polymer layers were formed by spin-coating water-soluble polymer solutions at different concentrations on respective light-emitting layers, and their thicknesses were measured by step. At this time, the rate and time of spin coating were maintained at constant values. The control of concentrations of the water-soluble polymer used to determine the thickness of water-soluble polymer having range of 1 to 10 nm or more. In this case, thicknesses of the water-soluble polymer layers in the range of 1 to 10 nm were determined from a linear relation between the thickness and the concentration (FIG. 2) by extrapolating the graph according to the least square method.

Polymer electroluminescent devices were fabricated using the respective water-soluble polymer layers having different thicknesses (each of which is simply expressed as thickness of polymer layer in FIGS. 3 and 4). The devices had a structure consisting of ITO/PEDOT:PSS/PFO/water-soluble polymer layer/LiF/Al.

The current and luminance values of the devices were compared (FIGS. 3 and 4).

The graphs of FIGS. 3 and 4 demonstrate that the polymer electroluminescent devices showed better results in terms of current and luminance than the conventional polymer electroluminescent device comprising no water-soluble polymer layer.

Particularly, the device comprising the 2 nm-thick water-soluble polymer layer, which corresponds to the use of the polyurethane at a concentration of 5.6 mg/cc, showed the best results in terms of current and luminance.

Example 1

Fabrication of Polymer Electroluminescent Device Comprising Cation-Containing Water-Soluble Polymer Layer According to the Present Invention An ITO-coated glass substrate was used as an anode substrate, and then a hole injection layer and a hole transport layer were formed thereon using PEDOT:PSS to aid the injection and transport of holes. A 30 nm-thick light-emitting layer composed of PFO blended with a hole transporting small molecule, α-NPD, was formed on the PEDOT:PSS layer by a wet process.

The cation-containing water-soluble polymer solution layer prepared above was spin-coated on the light-emitting layer to form a 2 nm-thick polymer layer. A LiF layer (0.8 nm) as an electron injection layer and an Al layer (120 nm) as a cathode were formed on the polymer layer by vacuum evaporation under $1\times10^{-6}$ Torr at an evaporation rate of 0.1 and 1 Å/sec, respectively, to complete the fabrication of a polymer electroluminescent device.

Comparative Example 1

Fabrication of Prior Art Polymer Electroluminescent Device

A polymer electroluminescent device was fabricated in the same manner as in Example 1, except that the cation-containing water-soluble polymer layer was not formed on the light-emitting layer.

Comparative Example 2

Fabrication of Polymer Electroluminescent Device Comprising Water-Soluble Polymer Layer A polymer electroluminescent device was fabricated in the same manner in Example 1, except that a water-soluble polyurethane resin was spin-coated on the light-emitting layer to form a 2 nm-thick water-soluble polymer layer instead of the cation-containing water-soluble polymer layer.

Comparative Example 3

Fabrication of Polymer Electroluminescent Device Comprising Bilayer Structure Consisting of Water-Soluble Polymer Layer and Ionic Compound Layer A polymer electroluminescent device was fabricated in the same manner in Example 1, except that a water-soluble polyurethane resin was spin-coated on the light-emitting layer to form a 2 nm-thick layer and the polyurethane resin containing an ionic compound, $Cs_2CO_3$, was spin-coated on the pure polyurethane layer to form a 2 nm-thick layer instead of the cation-containing water-soluble polymer layer.

Test Example 1

Evaluation of Current, Luminance and Luminescence Efficiency of the Polymer Electroluminescent Devices Fabricated in Example 1 and Comparative Examples 1 to 3

Voltages were applied to the polymer electroluminescent devices fabricated in Example 1 and Comparative Examples 1 to 3 to evaluate the current-voltage (I-V) characteristics, luminance-voltage (L-V) characteristics and luminescence efficiency-voltage (E-V) characteristics of the devices.

Characterization systems (KEITHLEY 2400, KEITHLEY 195A) were used to calculate current values in response to the voltages applied to the devices and express light emitted from the devices in amperes (A). The data were collected into luminance and efficiency databases using a program (Test Point). The I-V, L-V and E-V characteristics of the devices were evaluated. The results are shown in FIGS. 5 to 7, respectively.

The graphs of FIGS. 5 to 7 indicate that the polymer electroluminescent devices of Example 1 and Comparative Examples 1 to 3 showed I-V, L-V and E-V characteristics of typical light-emitting devices. In addition, it could be confirmed that the device comprising a cation-containing water-soluble polymer layer (Example 1) showed excellent characteristics in terms of current, luminance and luminescence efficiency when compared to the device comprising no water-soluble polymer layer (Comparative Example 1), the device comprising a water-soluble polymer layer (Comparative Example 2) and the device comprising a water-soluble polymer layer and the water-soluble polymer layer containing an ionic compound where both cations and anions exist (Comparative Example 3).

Particularly, as can be seen from the graph of FIG. 6 showing the luminance characteristics of the devices, the device of Comparative Example 3 had a luminance of $1,110 cd/m^2$ at an applied voltage of 10.5V, whereas the device of Example 1 had a luminance of $4,836 d/m^2$ at the same voltage. Further, there was no significant difference in luminance characteristics between the devices of Example 1 and Comparative Examples 1 and 2 until the applied voltage reached 7.5 V, but thereafter, the luminance of the device of Example 1 began to sharply increase when compared to that of the devices of Comparative Examples 1 and 2. The reason for the increased luminance of the device of Example 1 is believed to be caused by an attractive Coulomb force between the cations in the water-soluble polymer layer and the electrons in cathode, thus drastically increase in electron injection to the polymer layers.

Referring to the graph of FIG. 7 that shows the luminescence efficiency of the devices, the device of Example 1 had a luminescence efficiency of 0.98 cd/A at an applied voltage of about 7V, while the device of Comparative Example 1 had a luminescence efficiency of 0.37 cd/A at the same voltage. The presence of the cation-containing water-soluble polymer layer in the device of Example 1 demonstrates the much higher luminescence efficiency. In addition, the device of Example 1 had a higher luminescence efficiency (0.98 cd/A) than the device of Comparative Example 3 (0.8 cd/A).

Industrial Applicability

The polymer electroluminescent device of the present invention can find use in a variety of flat panel displays, including passive and active matrix organic electroluminescent displays.

The invention claimed is:

1. A polymer electroluminescent device comprising an anode, a light-emitting layer, a cation-containing water-soluble polymer layer and a cathode formed in this order on a substrate wherein the cation-containing water-soluble polymer layer is formed by wet coating, wherein the cation-containing water-soluble polymer layer has a thickness of 1 to 10 nm.

2. The device according to claim 1, wherein the cation-containing water-soluble polymer layer contains a water-soluble polyurethane resin.

3. The device according to claim 2, wherein the water-soluble polyurethane resin is polyurethane-polyurea, polyurethane-polyacrylate, or a mixture thereof.

4. The device according to claim 1, wherein the cation-containing water-soluble polymer layer contains at least one kind of cations selected from the group consisting of $Cs^+$, $Li^+$, $Na^+$, $K^+$, $Be^{2+}$, $Mg^{2+}$, $Ca^{2+}$, $Ba^{2+}$, $Al^{3+}$ and $Ag^{2+}$ cations.

5. The device according to claim 1, wherein the light-emitting layer may be composed of a blue, red or green light emitting material.

6. The device according to claim 1, further comprising at least one layer selected from the group consisting of a hole injection layer, a hole transport layer, an electron transport layer and an electron injection layer between the anode and the cathode.

7. The device according to claim 1, wherein the device has a multilayer structure consisting of: an anode/a hole injection layer/a light-emitting layer/a cation-containing water-soluble polymer layer/a cathode; an anode/a hole injection layer/a light-emitting layer/a cation-containing water-soluble polymer layer/an electron injection layer/a cathode; an anode/a hole injection layer/a hole transport layer/a light-emitting layer/a cation-containing water-soluble polymer layer/a cathode; an anode/a hole injection layer/a hole transport layer/a light-emitting layer/a cation-containing water-soluble polymer layer/an electron injection layer/a cathode; or an anode/a hole injection layer/a hole transport layer/a light-emitting layer/a cation-containing water-soluble polymer layer/an electron transport layer/an electron injection layer/a cathode.

8. A method for fabricating a polymer electroluminescent device, the method comprising the steps of forming an anode on a substrate, forming a light-emitting layer on the anode, forming a cation-containing water-soluble polymer layer on the light-emitting layer and a cathode on the cation-containing water-soluble polymer layer wherein the cation-containing water-soluble polymer layer is formed by wet coating, wherein the cation-containing water-soluble polymer layer has a thickness of 1 to 10 nm.

9. The method according to claim 8, wherein the wet coating is performed using a solution of a water-soluble polymer in cation-containing distilled water.

10. The method according to claim 9, wherein the water-soluble polymer is a water-soluble polyurethane resin.

11. The method according to claim 9, wherein the water-soluble polymer is present at a concentration of 0.4 to 2% by weight in the cation-containing solution of the water-soluble polymer.

12. The method according to claim 9, wherein the cation-containing distilled water is prepared by purifying a solution of an ionic compound containing both cations and anions by column chromatography to selectively separate the cations only.

13. The method according to claim 9, wherein the cations are present at a concentration of 1 to 20 ppm in the cation-containing distilled water.

14. The method according to claim 8, wherein the cations are selected from the group consisting of $Cs^+$, $Li^+$, $Na^+$, $Be^{2+}$, $Mg^{2+}$, $Ca^{2+}$, $Ba^{2+}$, $Al^{3+}$ and $Ag^{2+}$ cations, and combinations thereof.

15. The method according to claim 8, further comprising the step of forming at least one layer selected from the group consisting of a hole injection layer, a hole transport layer, an electron transport layer and an electron injection layer between anode and the cathode.

* * * * *

UNITED STATES PATENT AND TRADEMARK OFFICE
CERTIFICATE OF CORRECTION

PATENT NO. : 8,350,254 B2
APPLICATION NO. : 12/668528
DATED : January 8, 2013
INVENTOR(S) : Park et al.

It is certified that error appears in the above-identified patent and that said Letters Patent is hereby corrected as shown below:

In the Specification:

Columns 5 and 6,
In the drawing at the bottom of the page, "Neutralized terminated prepolymer" should read
--Neutralized NCO terminated prepolymer--.

Signed and Sealed this
Twenty-fifth Day of June, 2013

Teresa Stanek Rea
*Acting Director of the United States Patent and Trademark Office*